US011475813B2

(12) United States Patent
Tung et al.

(10) Patent No.: US 11,475,813 B2
(45) Date of Patent: Oct. 18, 2022

(54) DISPLAY PANEL AND SCAN DRIVER CIRCUIT THEREOF SUITABLE FOR NARROW BORDER APPLICATION

(71) Applicant: AU Optronics Corporation, Hsin-Chu (TW)

(72) Inventors: Che-Wei Tung, Hsin-Chu (TW); Wei-Li Lin, Hsin-Chu (TW); Yu-Zuo Lin, Hsin-Chu (TW); Chia-Ming Chang, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 130 days.

(21) Appl. No.: 17/067,795

(22) Filed: Oct. 12, 2020

(65) Prior Publication Data

US 2021/0225240 A1 Jul. 22, 2021

(30) Foreign Application Priority Data

Jan. 22, 2020 (TW) .................................. 109102501

(51) Int. Cl.
*G09G 5/00* (2006.01)
*G09G 3/20* (2006.01)
*G11C 19/28* (2006.01)

(52) U.S. Cl.
CPC .............. *G09G 3/20* (2013.01); *G11C 19/28* (2013.01); *G09G 2300/043* (2013.01);
(Continued)

(58) Field of Classification Search
CPC .............. G09G 3/20; G09G 2300/042; G09G 2300/0452; G09G 2300/08;
(Continued)

(56) References Cited

U.S. PATENT DOCUMENTS 8,422,620 B2  4/2013  Su et al.
9,030,399 B2  5/2015  Tseng et al.
(Continued)

FOREIGN PATENT DOCUMENTS

CN  103280198 A  9/2013

OTHER PUBLICATIONS

ManHong Na et al., 4-side Micro Border 8k4k LCD with Oxide-TFT Gate Driver Embedded Array, Published Mar. 1, 2020, AU Optronics Corp.

*Primary Examiner* — Adam J Snyder
(74) *Attorney, Agent, or Firm* — WPAT, PC (57) ABSTRACT

A scan driver circuit including shift register units and gate control circuits is provided. The shift register units are in a peripheral area of a display panel, and for receiving first clock signals. The gate control circuits are in an active area of the display panel, and for receiving second clock signals. Each shift register unit is coupled with corresponding N of the gate control circuits, and for providing a corresponding one of the first clock signals as a control signal to the corresponding N of the gate control circuits. The corresponding N of the gate control circuits are coupled with corresponding M of gate lines. The corresponding N of the gate control circuits are for providing, according to the control signal, corresponding M of the second clock signals as M gate signals to the corresponding M of gate lines, in which M and N are positive integers.

17 Claims, 6 Drawing Sheets

(52) U.S. Cl.
CPC . *G09G 2300/0452* (2013.01); *G09G 2300/08* (2013.01); *G09G 2310/0205* (2013.01); *G09G 2310/0218* (2013.01); *G09G 2310/0267* (2013.01); *G09G 2310/0286* (2013.01); *G09G 2310/0291* (2013.01); *G09G 2310/08* (2013.01)

(58) Field of Classification Search
CPC ... G09G 2310/0205; G09G 2310/0218; G09G 2310/0267; G09G 2310/0286; G09G 2310/0291; G09G 2310/08; G11C 19/28
See application file for complete search history.

(56) References Cited

U.S. PATENT DOCUMENTS

| | | | |
|---|---|---|---|
| 2007/0229433 A1* | 10/2007 | Jang | G09G 3/3677 345/96 |
| 2009/0041177 A1* | 2/2009 | Chien | G11C 19/28 377/64 |
| 2012/0212275 A1* | 8/2012 | Jang | G09G 3/3677 327/295 |
| 2013/0222357 A1 | 8/2013 | Tseng et al. | |
| 2015/0235590 A1 | 8/2015 | Peng | |
| 2016/0358666 A1* | 12/2016 | Pang | G09G 3/3677 |
| 2017/0047030 A1* | 2/2017 | Kim | G09G 3/3677 |
| 2017/0178558 A1* | 6/2017 | Zhou | G09G 3/2092 |

\* cited by examiner

DISPLAY PANEL AND SCAN DRIVER CIRCUIT THEREOF SUITABLE FOR NARROW BORDER APPLICATION

RELATED APPLICATION

This application claims priority to Taiwan Application Number 109102501, filed on Jan. 22, 2020, which is herein incorporated by reference in its entirety.

BACKGROUND

Technical Field

The present disclosure generally relates to a display panel. More particularly, the present disclosure relates to a display panel and a related scan driver circuit suitable for narrow border application.

Description of Related Art

The narrow border design is often used in personal computer screens or house using televisions to provide visual immersion for game playing or movie watching. In addition, the vigorous development of high-bandwidth communication technology has prompted the popularization of high-quality video and audio streaming. Therefore, high resolution (e.g., 4K) and narrow border have become basic requirements for consumers to purchase displays. Compared with conventional televisions, the high resolution televisions have a higher pixel density (i.e., pixel per inch, PPI), and thus need scan driver circuits with more stages. However, a scan driver circuit with a large number of stages is unfavorable for reducing the border width of a display.

SUMMARY

The disclosure provides a scan driver circuit including multiple stages of shift register unit and multiple gate control circuits. The multiple stages of shift register unit are disposed in a peripheral area of a display panel, and are configured to receive multiple first clock signals. The multiple gate control circuits are disposed in an active area of the display panel, and configured to receive multiple second clock signals. The active area includes multiple pixel circuits, and the multiple pixel circuits are coupled with multiple gate lines of the display panel. Each stage of shift register unit is coupled with corresponding N of the multiple gate control circuits, and is configured to provide a corresponding one of the multiple first clock signals as a control signal to the corresponding N of the multiple gate control circuits. The corresponding N of the multiple gate control circuits are coupled with corresponding M of the multiple gate lines. The corresponding N of the multiple gate control circuits are configured to provide, according to the control signal, corresponding M of the multiple second clock signals respectively as M gate signals to the corresponding M of the multiple gate lines, respectively, in which M and N are positive integers.

The disclosure provides a display panel including multiple pixel circuits disposed in an active area, multiple control lines, multiple gate lines, and a scan driver circuit. The multiple control lines and the multiple gate lines are extended from a peripheral area into the active area. The scan driver circuit includes multiple stages of shift register unit and multiple gate control circuits. Each of the multiple stages of shift register unit is coupled with corresponding N of the multiple gate control circuits through corresponding M of the multiple control lines, is configured to provide a corresponding one of the multiple first clock signals as a control signal, and is configured to provide the control signal to the corresponding N of the multiple gate control circuits through the corresponding M of the multiple control lines. The corresponding N of the multiple gate control circuits are coupled with the corresponding M of the multiple gate lines. The corresponding N of the multiple gate control circuits are configured to provide, according to the control signal, corresponding M of the multiple second clock signals respectively as M gate signals to the corresponding M of the multiple gate lines, respectively, in which M and N are positive integers.

It is to be understood that both the foregoing general description and the following detailed description are by examples, and are intended to provide further explanation of the disclosure as claimed.

DETAILED DESCRIPTION

Reference will now be made in detail to the present embodiments of the disclosure, examples of which are illustrated in the accompanying drawings. Wherever possible, the same reference numbers are used in the drawings and the description to refer to the same or like parts.

Figure 1:
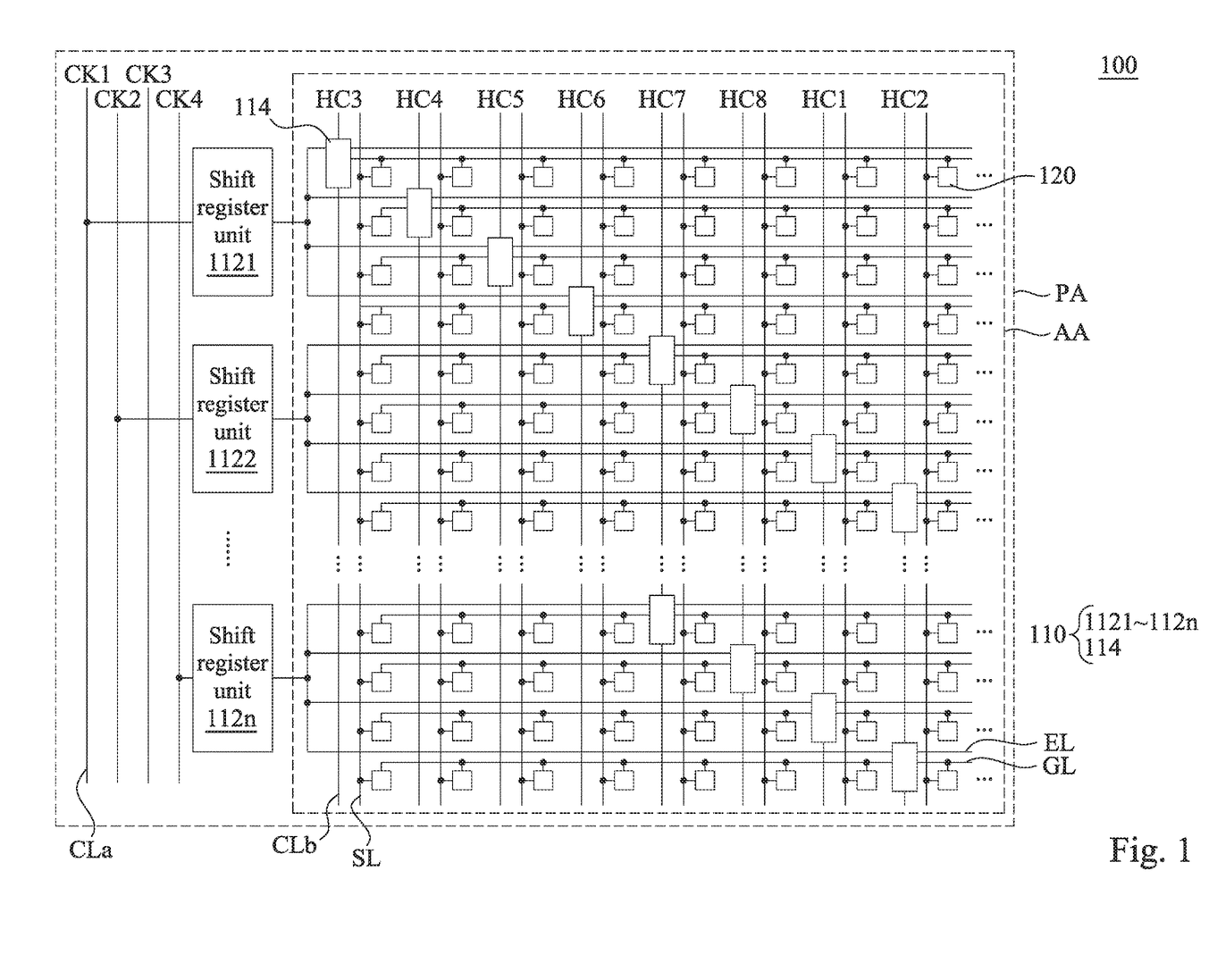
FIG. 1 is a simplified functional block diagram of a display panel according to one embodiment of the present disclosure.

FIG. 1 is a simplified functional block diagram of a display panel 100 according to one embodiment of the present disclosure. The display panel 100 comprises a scan driver circuit 110, a plurality of pixel circuits 120, a plurality of gate lines GL, a plurality of data lines SL, a plurality of control lines EL, a plurality of first clock lines CLa, and a plurality of second clock lines CLb. The first clock lines CLa are configured to correspondingly transmit a plurality of first clock signals CK1-CK4. The second clock lines CLb are configured to correspondingly transmit a plurality of second clock signals HC1-HC8. The pixel circuits 120 are disposed in an active area AA of the display panel 100, and are arranged correspondingly near intersections of the gate lines GL and the data lines SL. The display panel 100 provides data signals to the data lines SL to specify a gray value (brightness) for each pixel circuit 120, and a time point of each pixel circuit 120 to receive the data signal are determined by a signal on a corresponding gate line GL. In other words, the active area AA is an area which the pixel circuits 120 are arranged as an array to display pictures.

The scan driver circuit 110 comprises a plurality of stages of shift register unit 1121-112n and a plurality of gate control circuits 114. The shift register units 1121-112n are arranged in the peripheral area PA of the display panel 100, in which the peripheral area PA surrounds the active area AA. The gate control circuits 114 are arranged in the active area AA, in which each gate control circuit 114 is arranged near an intersection of a corresponding second clock line CLb and a corresponding control line EL. For illustration convenience, in this disclosure "shift register unit 112" will be used to refer to any non-specific one among the shift register units 1121-112n.

Each stage of shift register unit 112 is configured to receive a corresponding one of the first clock signals CK1-CK4 from the first clock line CLa. Each stage of shift register unit 112 is further coupled with corresponding four control lines EL, and is coupled with a corresponding gate control circuit 114 through each control line EL, but this disclosure is not limited thereto. Each gate control circuit 114 is configured to receive a corresponding one of the second clock signals HC1-HC8 from the second clock line CLb, and is coupled with a corresponding row of pixel circuit 120 through the gate line GL. The shift register unit 112 and the gate control circuits 114 coupled together are configured to cooperatively drive multiple corresponding rows of pixel circuit 120.

In some embodiments, based on practical requirements, each stage of shift register unit 112 may be coupled with the control lines EL of a non-specific number, and may be coupled with gate control circuits 114 of a non-specific number through each control line EL. For example, the shift register unit 112 may be coupled with eight control lines EL, and may be coupled with two or more than two gate control circuits 114 through each control line EL to increase driving ability. Any two gate control circuits 114, coupled with the same stage of shift register unit 112 and with the same control line EL, are coupled with the same gate line GL and receive the same one of the second clock signals HC1-HC8. On the other hand, any two gate control circuits 114, coupled with the same stage of shift register unit 112 but with different gate lines GL, receive different two of the second clock signals HC1-HC8.

Although only one column of pixel circuit 120 is arranged between two adjacent second clock lines CLb in the embodiment of FIG. 1, multiple columns of pixel circuit 120 may be arranged between two adjacent second clock lines CLb in practice, so as to distribute the gate control circuits 114 evenly in the active area AA.

Figure 2:
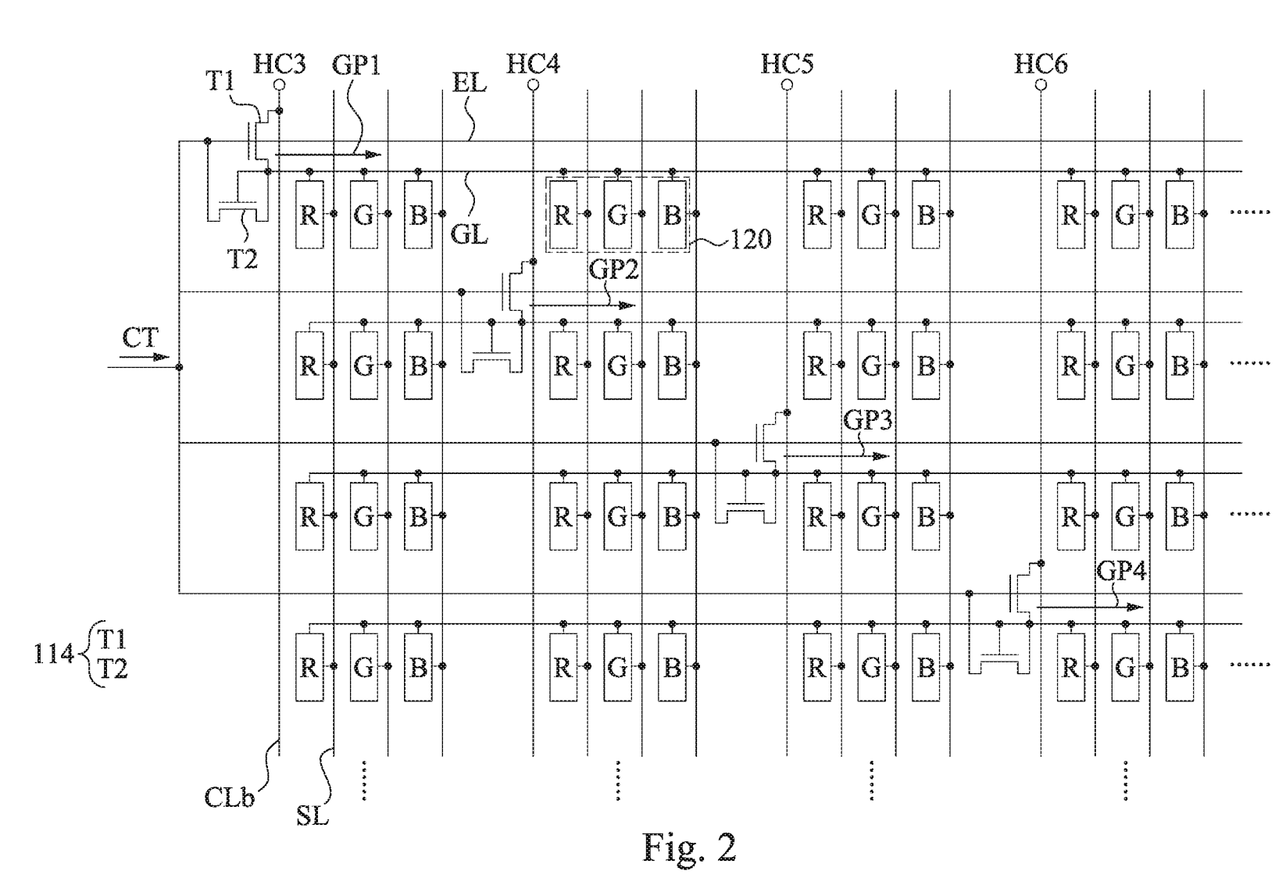
FIG. 2 is an enlarged view of a portion of the display panel according to one embodiment of the present disclosure.

FIG. 2 is an enlarged view of a portion of the display panel 100 according to one embodiment of the present disclosure. As shown in FIG. 2, each gate control circuit 114 comprises a first transistor T1 and a second transistor T2, in which each of the first transistor T1 and the second transistor T2 comprises a first terminal, a second terminal, and a control terminal. The first terminal of the first transistor T1 is configured to receive a corresponding one of the second clock signals HC1-HC8. The second terminal of the first transistor T1 is coupled with a corresponding gate line GL, and is configured to provide a corresponding one of multiple gate signals GP1-GP4. The control terminal of the first transistor T1 is coupled with a corresponding shift register unit 112 through a corresponding control line EL. In this embodiment, the pixel circuit 120 comprises three sub-pixel circuits configured to provide red light, green light, and blue light, but this disclosure is not limited thereto. In practice, the number and color of sub-pixels in the pixel circuit 120 may be designed based on practical requirements.

Notably, the gate control circuits 114 of FIG. 2 are coupled with the same shift register unit 112, and are configured to receive the same control signal CT from that same shift register unit 112 through the control lines EL.

Figure 3:
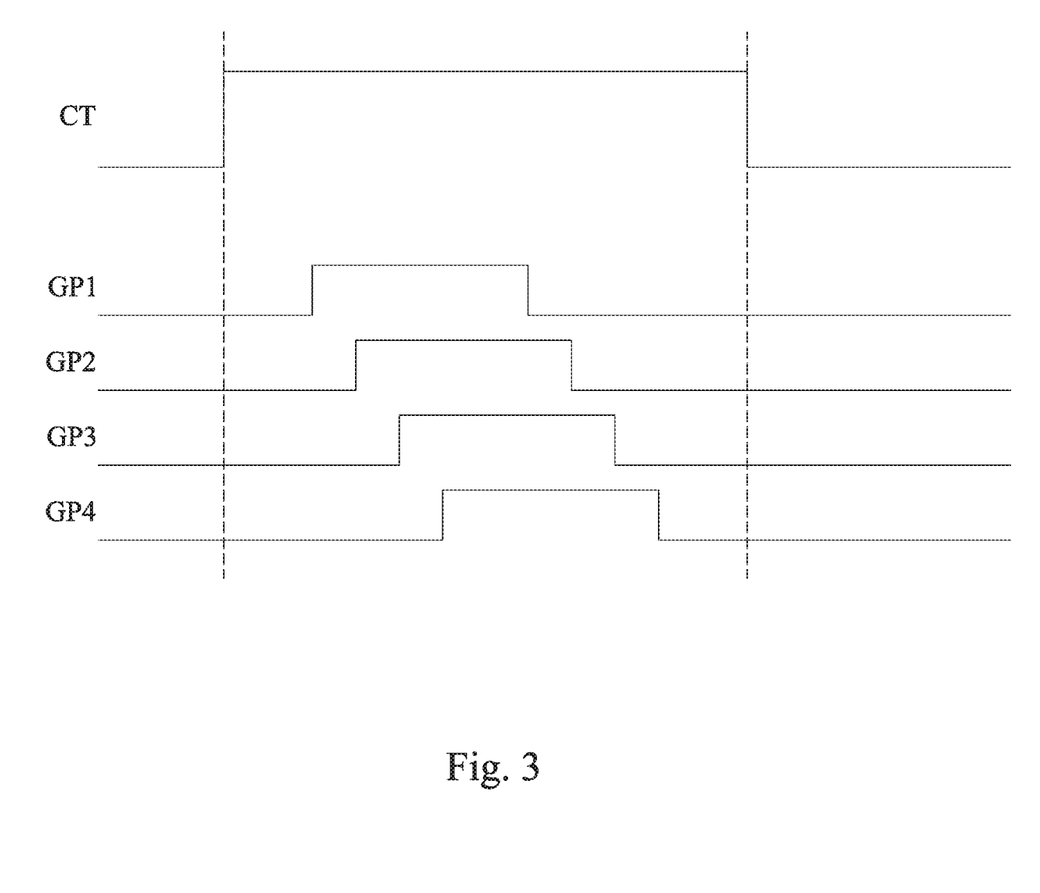
FIG. 3 is a waveform schematic of the control signal and the gate signals according to one embodiment of the present disclosure.

FIG. 3 is a waveform schematic of the control signal CT and the gate signals GP1-GP4 according to one embodiment of the present disclosure. Reference is made to FIG. 2 and FIG. 3. When the control signal CT has a logic high level, the first transistor T1 is conducted to output a corresponding one of the second clock signals HC1-HC8 as a corresponding one of the gate signals GP1-GP4 to the gate line GL, and the second transistor T2 is switched off. The second clock signals HC1-HC8 sequentially provide pulses as will be illustrated in the following FIG. 6. Therefore, the gate signals GP1-GP4 sequentially switch to the logic high level, and then sequentially switch to a logic low level, so as to sequentially drive multiple rows of pixel circuit 120 as shown in FIG. 2.

In this embodiment, to ensure that waveforms of the second clock signals HC1-HC8 can pass through the first transistor T1 without degradation, the highest voltage (or amplitude) of the control signal CT is set to be higher than the highest voltage (or amplitude) of each of the second clock signals HC1-HC8. In addition, a pulse width of the control signal CT is greater than a pulse width of each of the second clock signals HC1-HC8 (or each of the gate signals GP1-GP4).

When the control signal CT has the logic low level, the first transistor T1 and the second transistor T2 are switched off. In this situation, if the first transistor T1 is conducted accidentally due to oscillation of the second clock signals HC1-HC8, the second transistor T2 forms a diode-connected transistor to stabilize the gate line GL at approximate the logic low level of the control signal CT.

Figure 4:
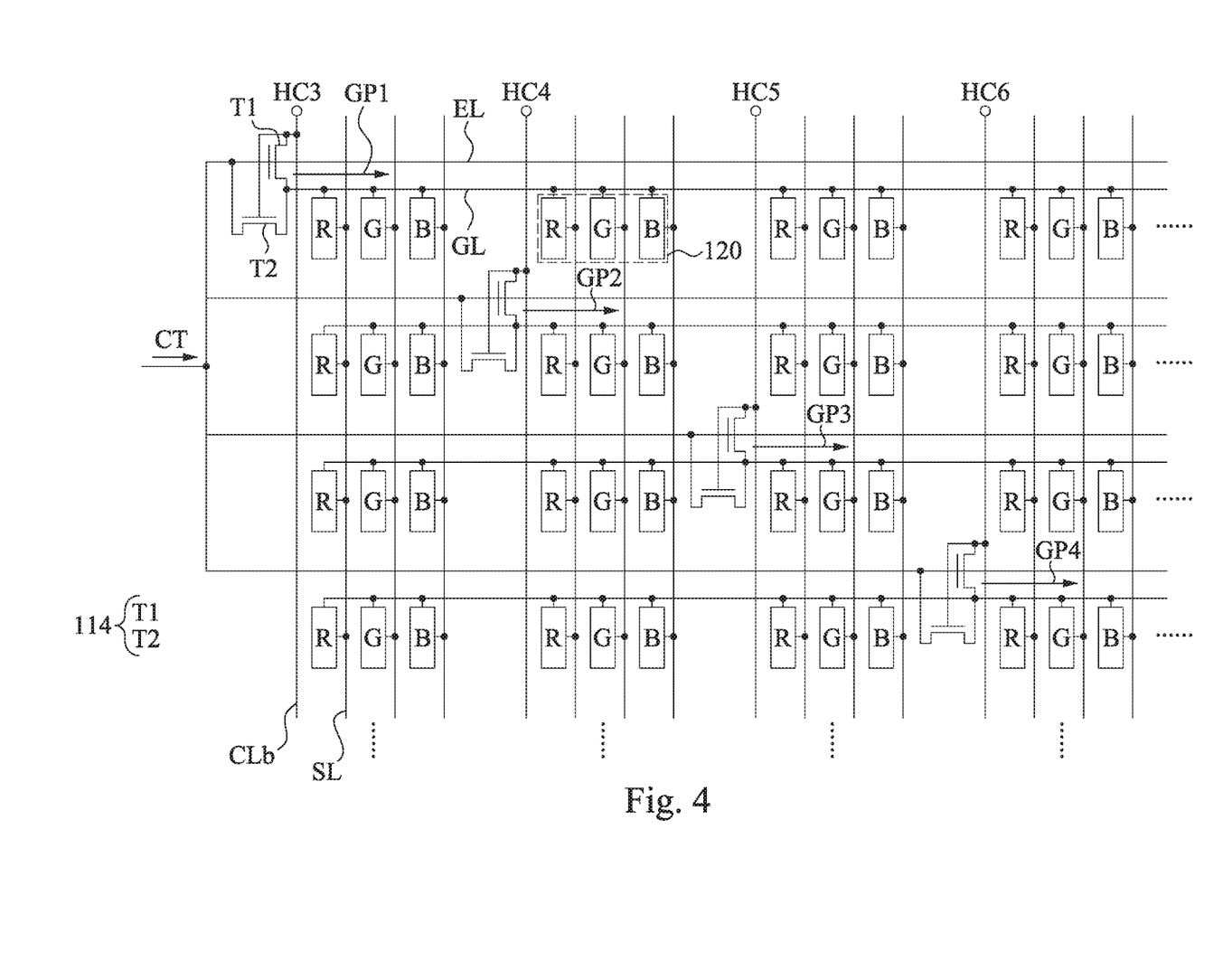
FIG. 4 is an enlarged view of a portion of the display panel according to another embodiment of the present disclosure.

FIG. 4 is an enlarged view of a portion of the display panel 100 according to another embodiment of the present disclosure. The gate control circuit 114 of FIG. 4 is similar to the gate control circuit 114 of FIG. 2, one of the differences is that the control terminal of the second transistor T2 of the gate control circuit 114 in FIG. 4 is coupled with the first terminal of the first transistor T1.

Figure 5:
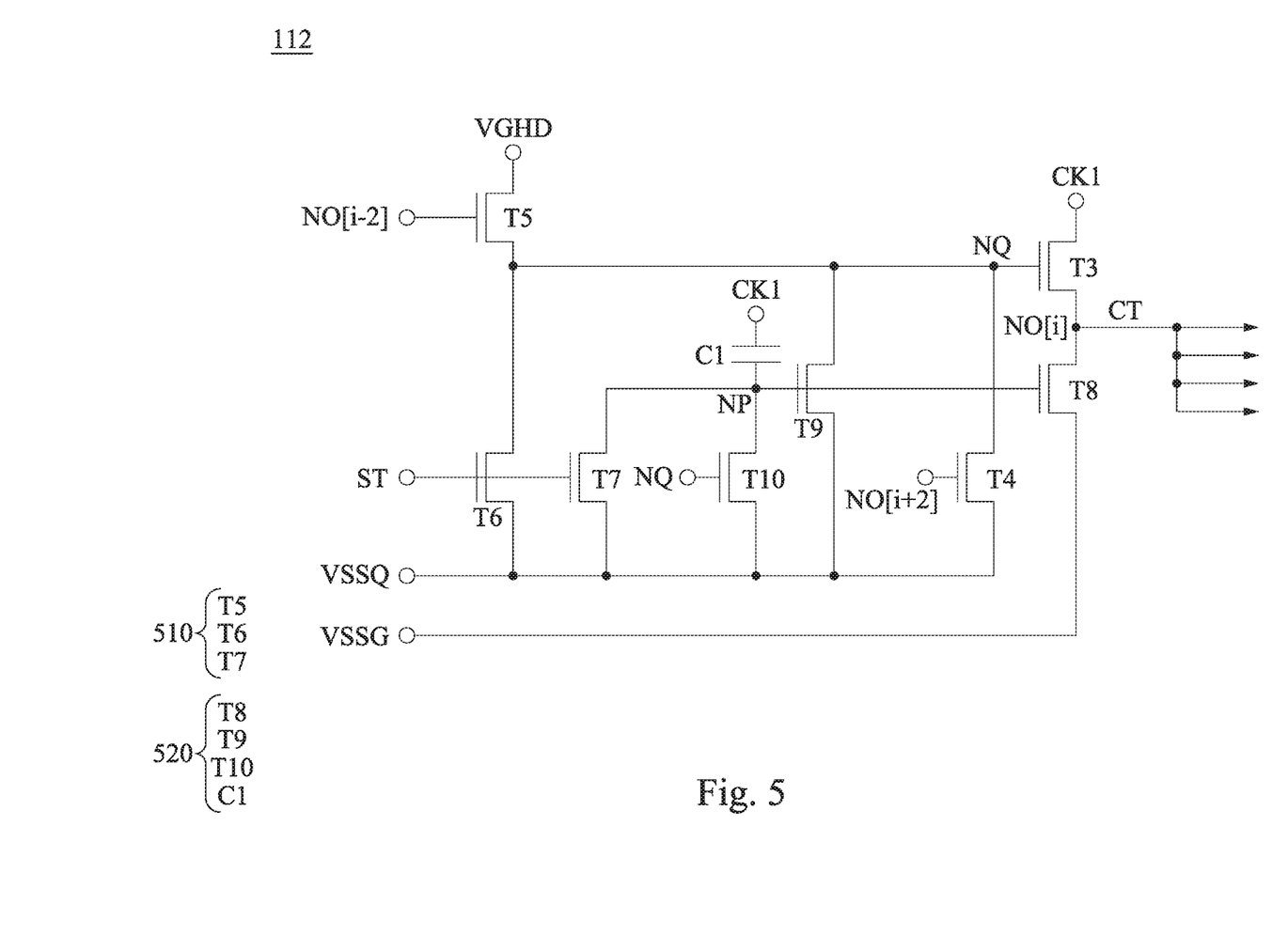
FIG. 5 is a circuit schematic of a shift register unit according to one embodiment of the present disclosure.

FIG. 5 is a circuit schematic of a shift register unit 500 according to one embodiment of the present disclosure. Each of the shift register units 1121-112n may be implemented by the shift register unit 500. The shift register unit 500 comprises an output node NO[i], a driving node NQ, a voltage stabilization node NP, a third transistor T3, a fourth transistor T4, a voltage input circuit 510, and a voltage stabilization circuit 520. The output node NO[i] is configured to provide the control signal CT, and is coupled with multiple corresponding control lines EL. The output node NO[i] is further coupled, through each control line EL, with one or more corresponding gate control circuits 114. For example, the output node NO[i] may be coupled with all of the control lines EL in FIG. 2.

Each of the third transistor T3 and the fourth transistor T4 comprises a first terminal, a second terminal, and a control terminal. The first terminal of the third transistor T3 is configured to receive a corresponding one of the first clock signals CK1-CK4 (e.g., the first clock signal CK1). The second terminal of the third transistor T3 is coupled with the output node NO[i]. The control terminal of the third transistor T3 is coupled with the driving node NQ. That is, the third transistor T3 is configured to provide the corresponding one of the first clock signals CK1-CK4 to the output node NO[i] as the control signal CT. The first terminal of the fourth transistor T4 is coupled with the driving node NO.

The second terminal of the fourth transistor T4 is configured to receive the first reference voltage VSSQ. The control terminal of the fourth transistor T4 is coupled with an output node NO[i+2] of a post-two stage shift register unit 112 among the shift register units 1121-112n.

The voltage input circuit 510 is configured to set the driving node NQ and the voltage stabilization node NP to the first reference voltage VSSQ or to set the driving node NQ to a second reference voltage VGHD, according to a voltage of an output node NO[i−2] of a previous-two stage shift register unit 112 among the shift register units 1121-112n and also according to the start signal ST. In specific, the voltage input circuit 510 comprises a fifth transistor T5, a sixth transistor T6, and a seventh transistor T7, in which each of the fifth transistor T5, the sixth transistor T6, and the seventh transistor T7 comprises a first terminal, a second terminal, and a control terminal. The first terminal of the fifth transistor T5 is configured to receive the second reference voltage VGHD. The second terminal of the fifth transistor T5 is coupled with the driving node NQ. The control terminal of the fifth transistor T5 is coupled with the output node NO[i−2] of the previous-two stage shift register unit 112. The first terminal of the sixth transistor T6 is coupled with the driving node NQ. The second terminal of the sixth transistor T6 is configured to receive the first reference voltage VSSQ. The control terminal of the sixth transistor T6 is configured to receive the start signal ST. The first terminal of the seventh transistor T7 is coupled with the voltage stabilization node NP. The second terminal of the seventh transistor T7 is configured to receive the first reference voltage VSSQ. The control terminal of the seventh transistor T7 is configured to receive the start signal ST.

In this embodiment, the start signal ST may provide a pulse when each frame is started to conduct the sixth transistor T6 and the seventh transistor T7, so as to reset voltages of the driving node NQ and the voltage stabilization node NP.

The voltage stabilization circuit 520 is configured to stabilize voltages of the driving node NQ and the output node NO[i], according to a corresponding one of the first clock signals CK1-CK4 (e.g., the first clock signal CK1) and a voltage of the voltage stabilization node NP. In specific, the voltage stabilization circuit 520 comprises an eighth transistor T8, a ninth transistor T9, a tenth transistor T10, and a capacitor Cs, in which each of the eighth transistor T8, the ninth transistor T9, and the tenth transistor T10 comprises a first terminal, a second terminal, and a control terminal. The first terminal of the eighth transistor T8 is coupled with the output node NO[i]. The second terminal of the eighth transistor T8 is configured to receive the third reference voltage VSSG. The control terminal of the eighth transistor T8 is coupled with the voltage stabilization node NP. The first terminal of the ninth transistor T9 is coupled with the driving node NQ. The second terminal of the ninth transistor T9 is configured to receive the first reference voltage VSSQ. The control terminal of the ninth transistor T9 is coupled with the voltage stabilization node NP. The first terminal of the tenth transistor T10 is coupled with the voltage stabilization node NP. The second terminal of the tenth transistor T10 is configured to receive the first reference voltage VSSQ. The control terminal of the tenth transistor T10 is coupled with the driving node NQ. The capacitor Cs comprises a first terminal and a second terminal. The first terminal of the capacitor Cs is configured receive a corresponding one of the first clock signals CK1-CK4 (e.g., the first clock signal CK1). The second terminal of the capacitor Cs is coupled with the voltage stabilization node NP. In some embodiments, the clock signal received by the first terminal of the capacitor Cs is in phase with the clock signal received by the first terminal of the third transistor T3, but the first terminal of the capacitor Cs and the first terminal of the third transistor T3 need not to receive the same clock signal and may receive different clock signals.

Figure 6:
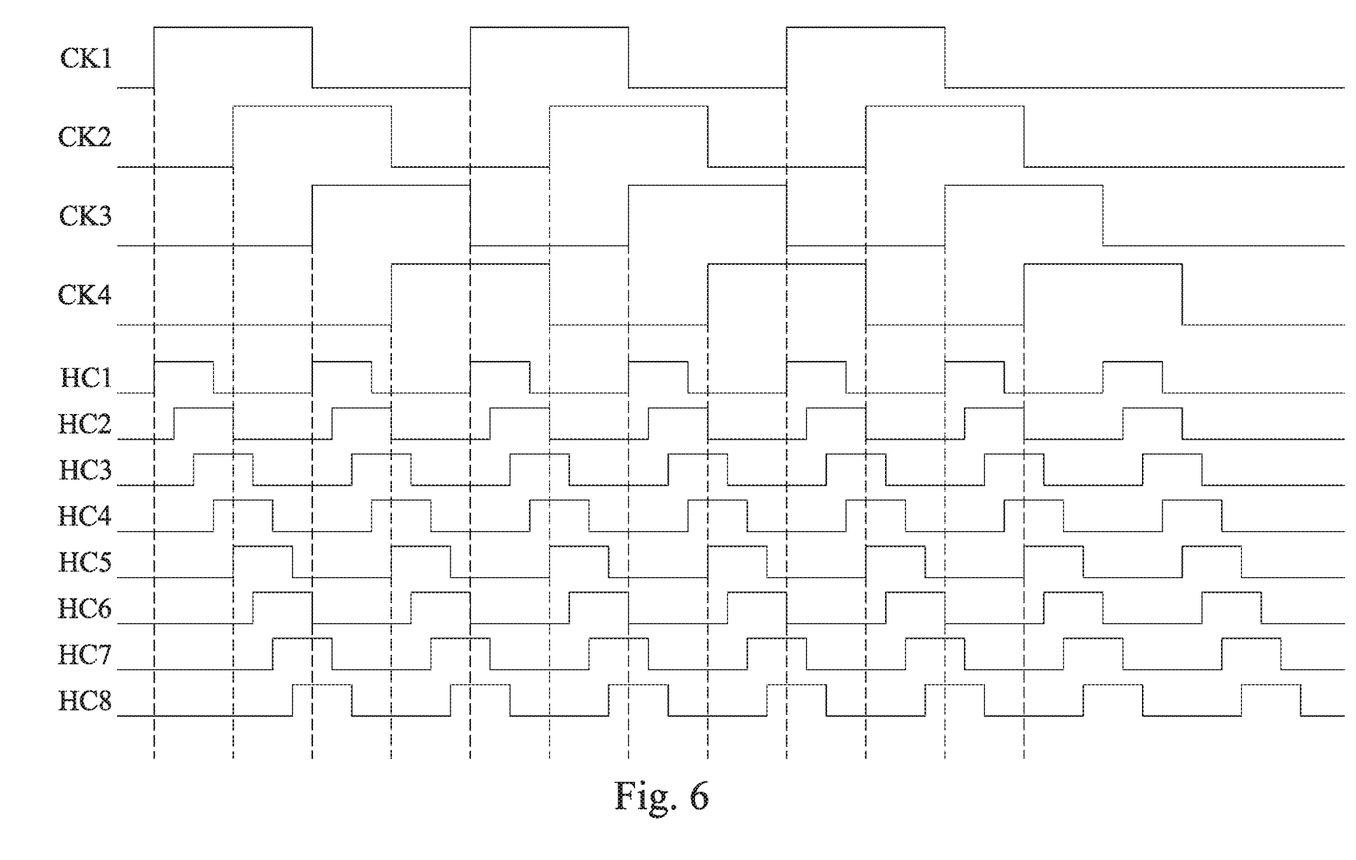
FIG. 6 is a waveform schematic of the first clock signals and the second clock signals according to one embodiment of the present disclosure.

FIG. 6 is a waveform schematic of the first clock signals CK1-CK4 and the second clock signals HC1-HC8 according to one embodiment of the present disclosure. Reference is made to FIG. 1 and FIG. 6. When the corresponding one of the first clock signals CK1-CK4 received by the shift register unit 112 has the logic high level, the shift register unit 112 outputs the control signal CT having the logic high level. On the other hand, when the corresponding one of the first clock signals CK1-CK4 received by the shift register unit 112 has the logic low level, the shift register unit 112 outputs the control signal CT having the logic low level.

For example, the shift register unit 1121 of FIG. 1 outputs the control signal CT having the logic high level when the first clock signal CK1 has the logic high level. In this situation, the gate control circuit 114 coupled with the shift register unit 1121 provides the second clock signals HC3-HC6 as the gate signals GP1-GP4, respectively, to sequentially drive multiple corresponding rows of pixel circuit 120.

As another example, the shift register unit 1122 of FIG. 1 outputs control signal CT having the logic high level when the first clock signal CK2 has the logic high level. In this situation, the gate control circuit 114 coupled with the shift register unit 1122 provides the second clock signals HC7-HC8 and HC1-HC2 as the gate signals GP1-GP4, respectively, to sequentially drive multiple corresponding rows of pixel circuit 120, and so forth.

As aforementioned, to ensure that the waveforms of the second clock signals HC1-HC8 can be transmitted to the gate lines GL without degradation, the highest voltage (or amplitude) of each of the first clock signals CK1-CK4 is higher than the highest voltage (or amplitude) of each of the second clock signals HC1-HC8.

In addition, a pulse width of each of the first clock signals CK1-CK4 is greater than a pulse width of each of the second clock signals HC1-HC8.

Moreover, if each stage of the shift register unit 112 is coupled with M control lines EL, in the pulse duration of each of the first clock signals CK1-CK4, the second clock signals HC1-HC8 provide pulses of a number larger than or equal to M. For example, since each stage of the shift register unit 112 in FIG. 1 is coupled with four control lines EL, in the pulse duration of each of the first clock signals CK1-CK4, the second clock signals HC1-HC8 provide pulses of a number equal to eight. By designing the first clock signals CK1-CK4 to have greater pulse width, an output waveform of the gate control circuit 114 can be prevented from being affected by rising edges and falling edges of the first clock signals CK1-CK4.

In the aforementioned embodiments, the transistors of the shift register unit 112 and the gate control circuit 114 may be implemented by various suitable N-type transistors. For example, the thin-film transistor (TFT), MOSFETs, or bipolar junction transistors.

In some embodiments, the transistors of the shift register unit 112 and the gate control circuit 114 may be implemented by various P-type transistors. In this situation, the first clock signals CK1-CK4 and the second clock signals HC1-HC8 may have waveforms opposite to that depicted in FIG. 6.

As can be appreciated from the foregoing descriptions, each stage of the shift register unit 112 in this disclosure can simultaneously drive multiple rows of pixel circuit 120, different from the conventional shift register unit that can drive only one row of pixel circuit. Therefore, the display panel 100 needs few shift register units 112, helping to reduce width of the display border.

In addition, the positions at which the gate control circuits 114 are arranged on the gate lines GL may be adjusted freely to render the gate control circuits 114 be evenly distributed in the active area AA. Therefore, signals in the display panel 100 transmitted on the gate lines GL have low transmission delay.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The term "couple" is intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The term "and/or" may comprise any and all combinations of one or more of the associated listed items. In addition, the singular forms "a," "an," and "the" herein are intended to comprise the plural forms as well, unless the context clearly indicates otherwise.

Other embodiments of the present disclosure will be apparent to those skilled in the art from consideration of the specification and practice of the present disclosure disclosed herein. It is intended that the specification and examples be considered as exemplary only, with a true scope and spirit of the present disclosure being indicated by the following claims.

What is claimed is:

1. A scan driver circuit, comprising:
   a plurality of stages of shift register unit, disposed in a peripheral area of a display panel, and configured to receive a plurality of first clock signals; and
   a plurality of gate control circuits, disposed in an active area of the display panel, and configured to receive a plurality of second clock signals, wherein the active area comprises a plurality of pixel circuits, and the plurality of pixel circuits are coupled with a plurality of gate lines of the display panel,
   wherein each stage of shift register unit is coupled with corresponding N of the plurality of gate control circuits, and is configured to provide a corresponding one of the plurality of first clock signals as a control signal to the corresponding N of the plurality of gate control circuits,
   the corresponding N of the plurality of gate control circuits are coupled with corresponding M of the plurality of gate lines, and are configured to provide, according to the control signal, corresponding M of the plurality of second clock signals respectively as M gate signals to the corresponding M of the plurality of gate lines, respectively, where M and N are positive integers,
   wherein each of the corresponding N of the plurality of gate control circuits comprises:
   a first transistor, comprising a first terminal, a second terminal, and a control terminal, wherein the first terminal of the first transistor is configured to receive a corresponding one of the plurality of second clock signals, the second terminal of the first transistor is coupled with one of the corresponding M of the plurality of gate lines, and the control terminal of the first transistor is coupled with the shift register unit and configured to receive the control signal; and
   a second transistor, comprising a first terminal, a second terminal, and a control terminal, wherein the first terminal of the second transistor and the control terminal of the second transistor are coupled with the second terminal of the first transistor, and the second terminal of the second transistor is coupled with the control terminal of the first transistor.

2. The scan driver circuit of claim 1, wherein the corresponding one of the plurality of first clock signals has an amplitude greater than amplitudes of the corresponding M of the plurality of second clock signals.

3. The scan driver circuit of claim 1, wherein the corresponding one of the plurality of first clock signals has a first pulse width greater than a second pulse width of the corresponding M of the plurality of second clock signals.

4. The scan driver circuit of claim 3, wherein in a pulse duration of the corresponding one of the plurality of first clock signals, the plurality of second clock signals provide pulses of a number larger than or equal to M.

5. The scan driver circuit of claim 1, wherein two of the corresponding N of the plurality of gate control circuits are coupled with one of the corresponding M of the plurality of gate lines, and are configured to receive one of the corresponding M of the plurality of second clock signals.

6. The scan driver circuit of claim 1, wherein each of the plurality of stages of shift register unit comprises:
   an output node, coupled with the corresponding N of the plurality of gate control circuits, and configured to provide the control signal;
   a driving node;
   a voltage stabilization node;
   a third transistor, comprising a first terminal, a second terminal, and a control terminal, wherein a first terminal of the third transistor is configured to receive a corresponding one of the plurality of first clock signals, the second terminal of the third transistor is coupled with the output node, and the control terminal of the third transistor is coupled with the driving node;
   a fourth transistor, comprising a first terminal, a second terminal, and a control terminal, wherein a first terminal of the fourth transistor is coupled with the driving node, the second terminal of the fourth transistor is configured to receive a first reference voltage, and the control terminal of the fourth transistor is coupled with the output node of a post-two stage shift register unit of the plurality of stages of shift register unit;
   a voltage input circuit, configured to set the driving node and the voltage stabilization node to the first reference voltage or to set the driving node to a second reference voltage according to a voltage of the output node of a previous-two stage shift register unit of the plurality of stages of shift register unit and according to a start signal; and
   a voltage stabilization circuit, configured to stabilize voltages of the driving node and the output node according to the corresponding one of the plurality of first clock signals and a voltage of the voltage stabilization node.

7. The scan driver circuit of claim 6, wherein the voltage input circuit comprises:
a fifth transistor, comprising a first terminal, a second terminal, and a control terminal, wherein the first terminal of the fifth transistor is configured to receive the second reference voltage, the second terminal of the fifth transistor is coupled with the driving node, and the control terminal of the fifth transistor is coupled with the output node of the previous-two stage shift register unit;
a sixth transistor, comprising a first terminal, a second terminal, and a control terminal, wherein the first terminal of the sixth transistor is coupled with the driving node, the second terminal of the sixth transistor is configured to receive the first reference voltage, and the control terminal of the sixth transistor is configured to receive the start signal; and
a seventh transistor, comprising a first terminal, a second terminal, and a control terminal, wherein the first terminal of the seventh transistor is coupled with the voltage stabilization node, the second terminal of the seventh transistor is configured to receive the first reference voltage, and the control terminal of the seventh transistor is configured to receive the start signal.

8. The scan driver circuit of claim 6, wherein the voltage stabilization circuit comprises:
an eighth transistor, comprising a first terminal, a second terminal, and a control terminal, wherein the first terminal of the eighth transistor is coupled with the output node, the second terminal of the eighth transistor is configured to receive a third reference voltage, and the control terminal of the eighth transistor is coupled with the voltage stabilization node;
a ninth transistor, comprising a first terminal, a second terminal, and a control terminal, wherein the first terminal of the ninth transistor is coupled with the driving node, the second terminal of the ninth transistor is configured to receive the first reference voltage, and the control terminal of the ninth transistor is coupled with the voltage stabilization node;
a tenth transistor, comprising a first terminal, a second terminal, and a control terminal, wherein the first terminal of the tenth transistor is coupled with the voltage stabilization node, the second terminal of the tenth transistor is configured to receive the first reference voltage, and the control terminal of the tenth transistor is coupled with the driving node; and
a capacitor, comprising a first terminal and a second terminal, wherein the first terminal of the capacitor is configured to receive the corresponding one of the plurality of first clock signals or a corresponding other of the plurality of first clock signals, the second terminal of the capacitor is coupled with the voltage stabilization node, and the corresponding one of the plurality of first clock signals and the corresponding other of the plurality of first clock signals have a same phase.

9. A display panel, comprising:
a plurality of pixel circuits, disposed in an active area;
a plurality of control lines;
a plurality of gate lines, wherein the plurality of control lines and the plurality of gate lines are extended from a peripheral area into the active area; and
a scan driver circuit, comprising:
a plurality of stages of shift register unit, disposed in the peripheral area, and configured to receive a plurality of first clock signals; and
a plurality of gate control circuits, disposed in the active area, and configured to receive a plurality of second clock signals,
wherein each of the plurality of stages of shift register unit is coupled with corresponding N of the plurality of gate control circuits through corresponding M of the plurality of control lines, is configured to provide a corresponding one of the plurality of first clock signals as a control signal, and is configured to provide the control signal to the corresponding N of the plurality of gate control circuits through the corresponding M of the plurality of control lines,
the corresponding N of the plurality of gate control circuits are coupled with corresponding M of the plurality of gate lines, and are configured to provide, according to the control signal, corresponding M of the plurality of second clock signals respectively as M gate signals to the corresponding M of the plurality of gate lines, respectively, where M and N are positive integers,
wherein each of the corresponding N of the plurality of gate control circuits comprises:
a first transistor, comprising a first terminal, a second terminal, and a control terminal, wherein the first terminal of the first transistor is configured to receive a corresponding one of the plurality of second clock signals, the second terminal of the first transistor is coupled with one of the corresponding M of the plurality of gate lines, and the control terminal of the first transistor is coupled with the shift register unit through one of the corresponding M of the plurality of control lines and is configured to receive the control signal; and
a second transistor, comprising a first terminal, a second terminal, and a control terminal, wherein the first terminal of the second transistor and the control terminal of the second transistor are coupled with the second terminal of the first transistor, the second terminal of the second transistor is coupled with the control terminal of the first transistor.

10. The display panel of claim 9, wherein the corresponding one of the plurality of first clock signals has an amplitude greater than amplitudes of the corresponding M of the plurality of second clock signals.

11. The display panel of claim 9, wherein the corresponding one of the plurality of first clock signals has a first pulse width greater than a second pulse width of the corresponding M of the plurality of second clock signals.

12. The display panel of claim 11, wherein in a pulse duration of the corresponding one of the plurality of first clock signals, the plurality of second clock signals provide pulses of a number larger than or equal to M.

13. The display panel of claim 9, wherein two of the corresponding N of the plurality of gate control circuits are coupled with one of the corresponding M of the plurality of gate lines, and are configured to receive one of the corresponding M of the plurality of second clock signals.

14. The display panel of claim 9, wherein each of the plurality of stages of shift register unit comprises:
an output node, coupled with the corresponding M of the plurality of control lines, and configured to provide the control signal;
a driving node;
a voltage stabilization node;
a third transistor, comprising a first terminal, a second terminal, and a control terminal, wherein the first terminal of the third transistor is configured to receive the corresponding one of the plurality of first clock signals, the second terminal of the third transistor is coupled with the output node, and the control terminal of the third transistor is coupled with the driving node;

a fourth transistor, comprising a first terminal, a second terminal, and a control terminal, wherein the first terminal of the fourth transistor is coupled with the driving node, the second terminal of the fourth transistor is configured to receive a first reference voltage, and the control terminal of the fourth transistor is coupled with the output node of a post-two stage shift register unit of the plurality of stages of shift register unit;

a voltage input circuit, configured to set the driving node and the voltage stabilization node to the first reference voltage or to set the driving node to a second reference voltage according to a voltage of the output node of a previous-two stage shift register unit of the plurality of stages of shift register unit and according to a start signal; and a voltage stabilization circuit, configured to stabilize voltages of the driving node and the output node according to the corresponding one of the plurality of first clock signals and a voltage of the voltage stabilization node.

15. The display panel of claim 14, wherein the voltage input circuit comprises:

a fifth transistor, comprising a first terminal, a second terminal, and a control terminal, wherein the first terminal of the fifth transistor is configured to receive the second reference voltage, the second terminal of the fifth transistor is coupled with the driving node, and the control terminal of the fifth transistor is coupled with the output node of the previous-two stage shift register unit;

a sixth transistor, comprising a first terminal, a second terminal, and a control terminal, wherein the first terminal of the sixth transistor is coupled with the driving node, the second terminal of the sixth transistor is configured to receive the first reference voltage, and the control terminal of the sixth transistor is configured to receive the start signal; and a seventh transistor, comprising a first terminal, a second terminal, and a control terminal, wherein a first terminal of the seventh transistor is coupled with the voltage stabilization node, the second terminal of the seventh transistor is configured to receive the first reference voltage, and the control terminal of the seventh transistor is configured to receive the start signal.

16. The display panel of claim 14, wherein the voltage stabilization circuit comprises:

an eighth transistor, comprising a first terminal, a second terminal, and a control terminal, wherein the first terminal of the eighth transistor is coupled with the output node, the second terminal of the eighth transistor is configured to receive a third reference voltage, and the control terminal of the eighth transistor is coupled with the voltage stabilization node;

a ninth transistor, comprising a first terminal, a second terminal, and a control terminal, wherein a first terminal of the ninth transistor is coupled with the driving node, the second terminal of the ninth transistor is configured to receive the first reference voltage, and the control terminal of the ninth transistor is coupled with the voltage stabilization node;

a tenth transistor, comprising a first terminal, a second terminal, and a control terminal, wherein the first terminal of the tenth transistor is coupled with the voltage stabilization node, the second terminal of the tenth transistor is configured to receive the first reference voltage, and the control terminal of the tenth transistor is coupled with the driving node; and a capacitor, comprising a first terminal and a second terminal, wherein the first terminal of the capacitor is configured to receive the corresponding one of the plurality of first clock signals or a corresponding other of the plurality of first clock signals, the second terminal of the capacitor is coupled with the voltage stabilization node, and the corresponding one of the plurality of first clock signals and the corresponding other of the plurality of first clock signals have a same phase.

17. A scan driver circuit, comprising:

a plurality of stages of shift register unit, disposed in a peripheral area of a display panel, and configured to receive a plurality of first clock signals; and a plurality of gate control circuits, disposed in an active area of the display panel, and configured to receive a plurality of second clock signals, wherein the active area comprises a plurality of pixel circuits, and the plurality of pixel circuits are coupled with a plurality of gate lines of the display panel, wherein each stage of shift register unit is coupled with corresponding N of the plurality of gate control circuits, and is configured to provide a corresponding one of the plurality of first clock signals as a control signal to the corresponding N of the plurality of gate control circuits, the corresponding N of the plurality of gate control circuits are coupled with corresponding M of the plurality of gate lines, and are configured to provide, according to the control signal, corresponding M of the plurality of second clock signals respectively as M gate signals to the corresponding M of the plurality of gate lines, respectively, where M and N are positive integers, wherein each of the corresponding N of the plurality of gate control circuits comprises:

a first transistor, comprising a first terminal, a second terminal, and a control terminal, wherein the first terminal of the first transistor is configured to receive a corresponding one of the plurality of second clock signals, the second terminal of the first transistor is coupled with one of the corresponding M of the plurality of gate lines, and the control terminal of the first transistor is coupled with the shift register unit and configured to receive the control signal; and a second transistor, comprising a first terminal, a second terminal, and a control terminal, wherein the first terminal of the second transistor is coupled with the second terminal of the first transistor, the second terminal of the second transistor is coupled with the control terminal of the first transistor, and the control terminal of the second transistor is coupled with the first terminal of the first transistor.

* * * * *